(12) United States Patent
Kim et al.

(10) Patent No.: US 10,135,174 B2
(45) Date of Patent: Nov. 20, 2018

(54) DETACHABLE INDUSTRIAL NETWORK MODULE

(71) Applicant: ROBOTIS CO., LTD., Seoul (KR)

(72) Inventors: Byoung Soo Kim, Seoul (KR); In Yong Ha, Seoul (KR); Hyoungchul Nam, Seoul (KR)

(73) Assignee: ROBOTIS CO., LTD., Seoul (KR)

( * ) Notice: Subject to any disclaimer, the term of this patent is extended or adjusted under 35 U.S.C. 154(b) by 42 days.

(21) Appl. No.: 15/305,095

(22) PCT Filed: Apr. 28, 2014

(86) PCT No.: PCT/KR2014/003739
§ 371 (c)(1),
(2) Date: Oct. 18, 2016

(87) PCT Pub. No.: WO2015/167030
PCT Pub. Date: Nov. 5, 2015

(65) Prior Publication Data
US 2017/0040737 A1    Feb. 9, 2017

(30) Foreign Application Priority Data
Apr. 28, 2014   (KR) ................. 10-2014-0050939

(51) Int. Cl.
*H05K 5/00*     (2006.01)
*H01R 13/514*   (2006.01)
(Continued)

(52) U.S. Cl.
CPC ....... *H01R 13/514* (2013.01); *H01R 13/6461* (2013.01); *H04L 67/12* (2013.01);
(Continued)

(58) Field of Classification Search
CPC ... H01R 13/514; H01R 13/6461; H04L 67/12; H05K 5/0065; H05K 5/0247; H05K 5/0256; H05K 7/1471
See application file for complete search history.

(56) References Cited

U.S. PATENT DOCUMENTS

2006/0154531 A1   7/2006   Kim et al.

FOREIGN PATENT DOCUMENTS

| KR | 20-0407428 Y1 | 1/2006 |
|---|---|---|
| KR | 10-2009-0027301 A | 3/2009 |

(Continued)

OTHER PUBLICATIONS

International Search Report for PCT/KR2014/003739 dated Jan. 20, 2015 from Korean Intellectual Property Office.

*Primary Examiner* — Robert J Hoffberg
*Assistant Examiner* — Hung Dang
(74) *Attorney, Agent, or Firm* — Revolution IP, PLLC

(57) ABSTRACT

A detachable industrial network module, including: a housing in which a plurality of through holes are formed; and a communication module embedded in the housing and including a plurality of terminal portions to be electrically connected to an external device, wherein the through holes of the housing are provided in a lattice pattern and the housing is selectively detachable from or attachable to an outer surface of the actuator module, at least one guide groove is provided in the housing to prevent wiring bundles coupled to the terminal portions of the communication module from interfering with each other, and the communication module is electrically connected to the actuator module by a sub-connector as a medium.

9 Claims, 7 Drawing Sheets

(51) Int. Cl.
*H01R 13/6461* (2011.01)
*H04L 29/08* (2006.01)
*H05K 5/02* (2006.01)
*H05K 7/14* (2006.01)

(52) U.S. Cl.
CPC ......... *H05K 5/0065* (2013.01); *H05K 5/0247* (2013.01); *H05K 5/0256* (2013.01); *H05K 7/1471* (2013.01)

(56) References Cited

FOREIGN PATENT DOCUMENTS

| | | |
|---|---|---|
| KR | 10-2009-0090136 A | 8/2009 |
| KR | 10-2012-0105798 A | 9/2012 |
| KR | 10-2013-0119147 A | 10/2013 |

(a)　　　　(b)

DETACHABLE INDUSTRIAL NETWORK MODULE

CROSS REFERENCE TO PRIOR APPLICATIONS

This application is a National Stage Application of PCT International Patent Application No. PCT/KR2014/003739 filed on Apr. 28, 2014, under 35 U.S.C. § 371, which claims priority to Korean Patent Application No. 10-2014-0050939 filed on Apr. 28, 2014 which are all hereby incorporated by reference in their entirety.

TECHNICAL FIELD

The present invention relates to a detachable industrial network module, and more particularly, to a detachable industrial network module capable of effectively supporting network communication by being connected to a small actuator module.

BACKGROUND ART

In general, various robots are used at industrial sites, and such industrial robot systems control robot motions through position control, speed control, current control, and the like.

Recently, robot mechanisms that were conventionally applied in certain industrial fields have been applied to other industrial fields with the development of robotics, and accordingly, robots such as home cleaning robots, programing educational robots, toy robots, and the like for various uses such as home, education, entertainment, and the like are being manufactured.

In addition, the need for miniaturization and weight reduction of industrial network modules that control motors on the basis of network communication, such as Ethernet, has gradually increased recently in the industrial automation system market.

One of core technologies for such developments in the field of robotics is a technology for controlling an actuator, that is, a drive motor which is adopted in a robot.

When several to several tens of actuators are installed in one robot, a high level of control mechanism is necessary for precisely controlling each of the actuators and for simultaneously and organically controlling all the actuators to have relations with each other.

Particularly, when a plurality of actuators are controlled by one central controller, each of the actuators includes a sensor (an encoder) which detects a state of the actuator and a driver (a motor) for supplying a drive power to the actuator.

Here, because several to several tens of wirings are necessary between the actuator controller and the drivers or the controller (the motor controller) and the sensors, there are many restrictions on diversity in structures of robots due to difficulties in wiring as the number of actuators increases.

In addition, when the number of actuators has to be increased or decreased due to a design change of a robot, all of the actuator controller, sensor, and driver have to be changed accordingly.

Meanwhile, FIG. 1 is a view illustrating an actuator module including a conventional industrial network module.

As illustrated in FIGS. 1A and 1B, an industrial network module 10 including an industrial network is used for various kinds of actuator modules 30 and 50.

However, because the majority of conventional network modules 10 are a basic type coupled to a rear surface of the actuator module 30 or 50, there is a disadvantage in that they increase the entire weight and load of an apparatus for accommodating various connectors for controlling the actuator module 30 or 50.

Furthermore, when various manipulators using the actuator module 30 or 50 are implemented, because a use range decreases according to restrictions on use and an overall structure and installation processes are complex, management, such as maintenance and repair, is not easy.

DISCLOSURE

Technical Problem

The present invention is directed to providing a detachable industrial network module capable of supporting various networks by being connected to a small actuator module.

Technical Solution

One aspect of the present invention provides a detachable industrial network module which is detachable from or attachable to an actuator module including a driver, a decelerator, and a controller including a housing in which a plurality of through holes are formed, and a communication module embedded in the housing and including a plurality of terminal portions to be electrically connected to an external device, wherein the through holes of the housing are provided in a lattice pattern and the housing is selectively detachable from or attachable to an outer surface of the actuator module, at least one guide groove is provided in the housing to prevent wiring bundles coupled to the terminal portions of the communication module from interfering with each other, and the communication module is electrically connected to the actuator module by a sub-connector as a medium.

The housing may include a pair of fixing members to prevent the communication module from moving away from or falling off of the housing.

Each of the fixing members may include a seating portion that facilitates insertion and displacement of the communication module.

An opening which opens upward may be provided at one side of the housing to facilitate connection with the external device.

The communication module may include a first control board fixedly installed at the housing, a second control board coupled to one surface of the first control board, a first terminal through which a power signal of the external device is applied to the first control board, a second terminal through which a control signal of the external device is applied to the first control board, and a third terminal connected to the sub-connector through which the control signal of the external device is applied to the actuator module.

The second terminal may be disposed at one side of the first control board, the first terminal may be disposed at the other side, and the third terminal may be disposed on the second control board.

The second terminal of the communication module may include one among pluggable screw terminal, D-Subminiature, USB, RJ45, BNC, and M12 types.

The control signal of the external device may be provided through an industrial network, wherein the industrial network may use one among CANopen, CC-Link, PROFIBUS, EtherCAT, PROFINET, and DeviceNet protocols.

Coupling holes may be provided in an outer surface of the actuator module to correspond to the through holes of the housing.

Advantageous Effects

According to one embodiment of the present invention, structural utilization can be improved through various coupling methods for one actuator module by implementing a miniaturized and light-weight network module.

Furthermore, various cables can be easily detached and attached when used, and a simple connecting structure can be provided without interference between wiring bundles of the cables.

Effects of the present inventions are not limited to the above-described effects, and it should be understood that all effects which can be inferred from modes or constitutions described in the claims of the present invention are included.

MODES OF THE INVENTION

Figure 1:
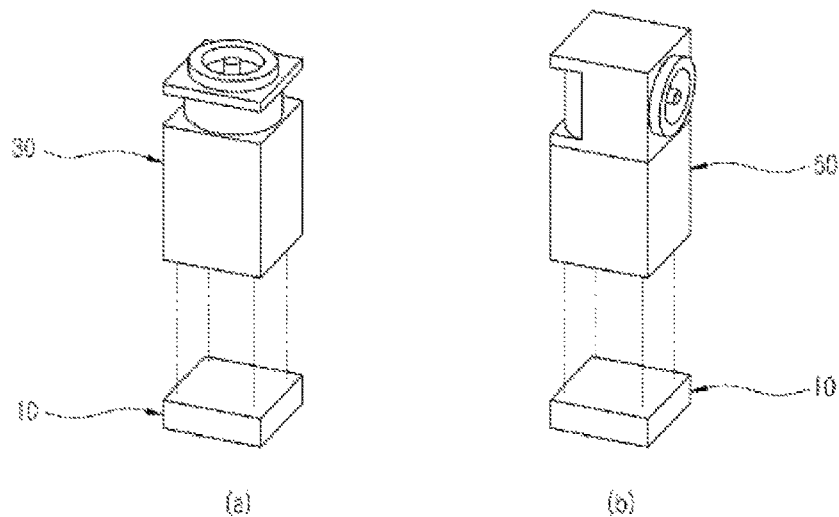
FIG. 1 is a view illustrating an actuator module including a conventional industrial network module.

Hereinafter, the present invention will be described in detail with reference to the accompanying drawings. However, embodiments of the present invention may be implemented in several different forms and are not limited to the embodiments described herein. In addition, parts irrelevant to description are omitted in the drawings in order to clearly explain embodiments of the present invention. Similar parts are denoted by similar reference numerals throughout this specification.

Throughout this specification, when a part is referred to as being "connected" to another part, this includes "direct connection" and "indirect connection" via an intervening part. Also, when a certain part "includes" a certain component, other components are not excluded unless explicitly described otherwise, and other components may in fact be included.

Hereinafter, embodiments of the present invention will be described in detail with reference to the accompanying drawings.

Figure 2:
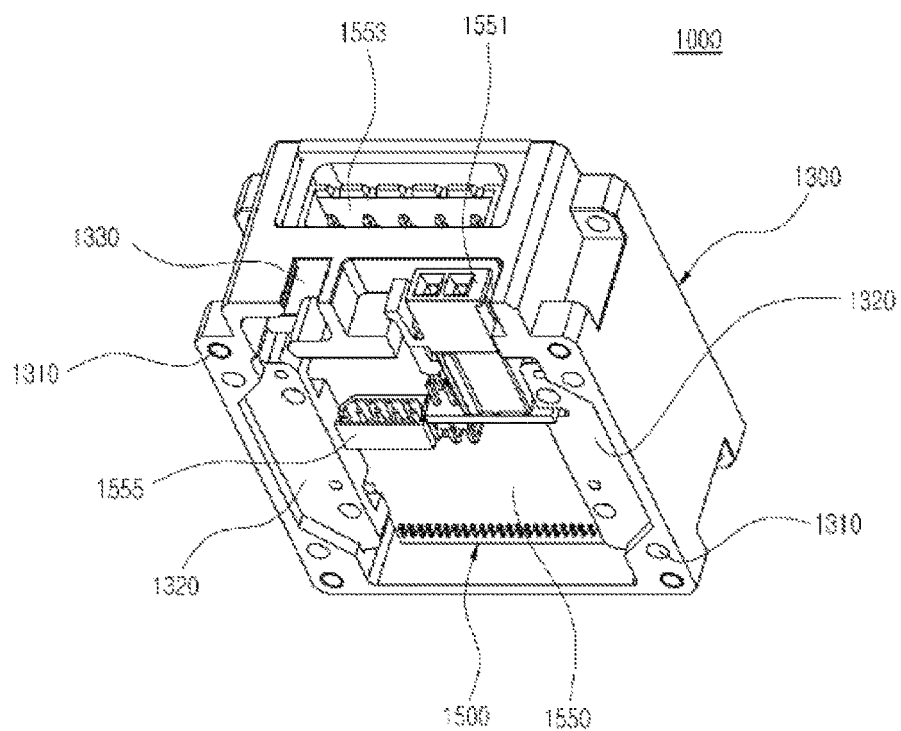
FIG. 2 is a view illustrating a detachable industrial network module according to the present invention.
Figure 3:
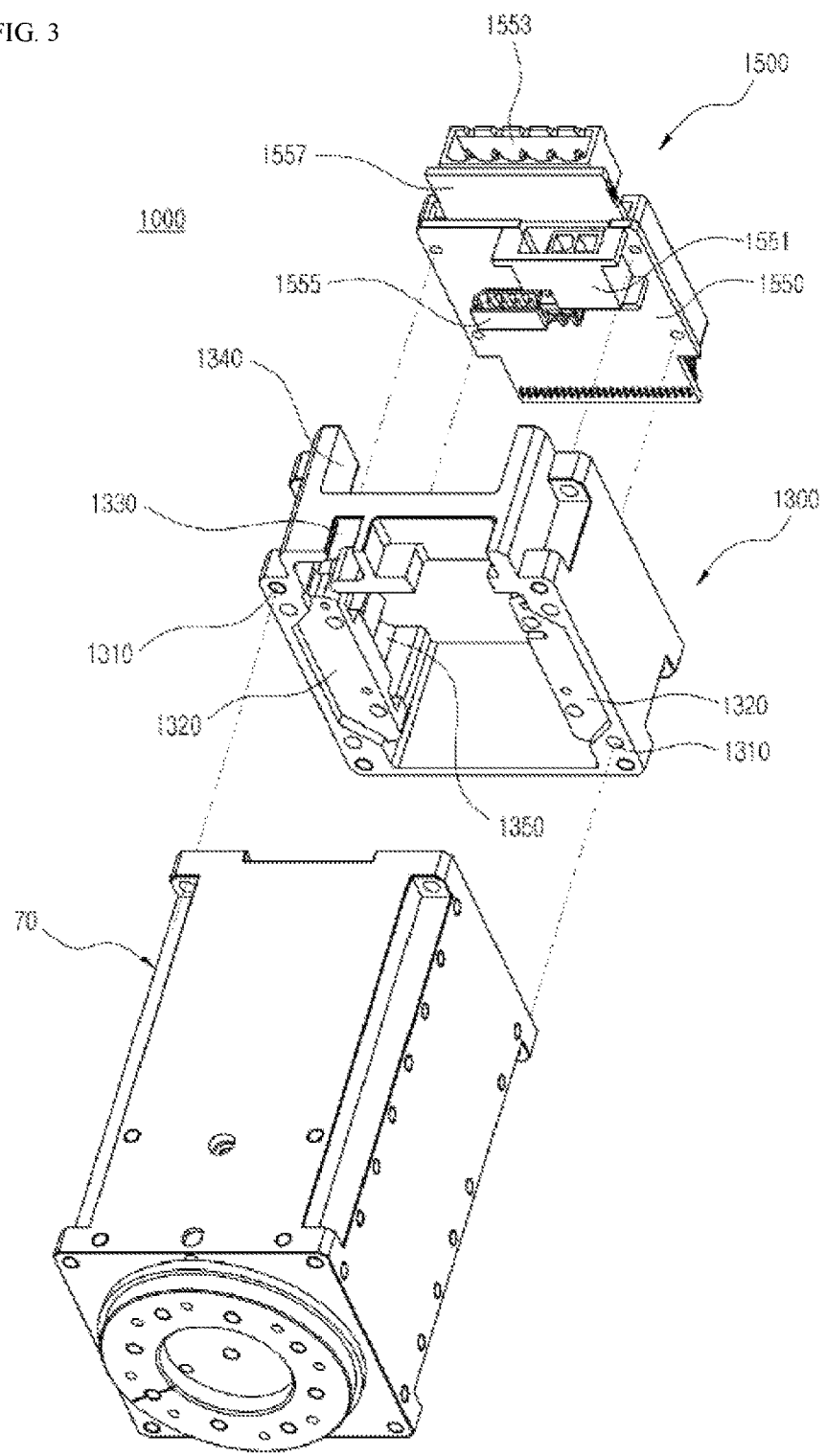
FIG. 3 is an exploded view illustrating the detachable industrial network module according to the present invention.
Figure 4:
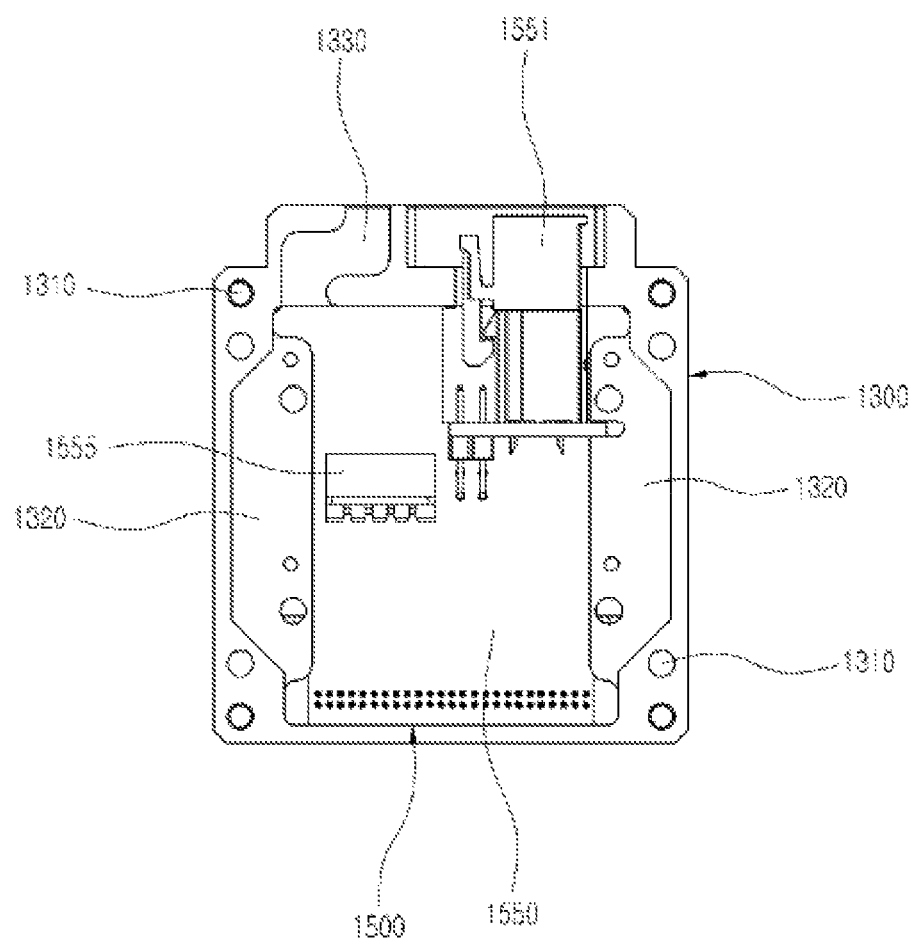
FIG. 4 is a front view illustrating the detachable industrial network module according to the present invention.

The following description of an embodiment of the present invention will be based on FIG. 2 showing a view illustrating a detachable industrial network module according to the present invention, FIG. 3 showing an exploded view illustrating the detachable industrial network module according to the present invention, and FIG. 4 showing a front view illustrating the detachable industrial network module according to the present invention.

First, as illustrated in FIGS. 2 and 3, a detachable industrial network module 1000 according to the present embodiment is provided by coupling a housing 1300 and a communication module 1500.

Here, in the housing 1300, a plurality of through holes 1310 are formed and a pair of fixing members 1320 are included to prevent the communication module 1500 from moving away from or falling off of the housing 1300.

Furthermore, the fixing members 1320 may each further include a seating portion 1350 so that insertion and installation of the communication module 1500 is easy.

An opening 1340 which opens upward is provided at one side of the housing 1300 for easy connection with external devices.

The communication module 1500 includes a first control board 1550, a second control board 1557, and a plurality of terminal portions embedded in the housing 1300 and configured to be electrically connected to the external devices. For example, in the present embodiment, the plurality of terminal portions may include a first terminal 1551, a second terminal 1553, and a third terminal 1555.

The first control board 1550 may be provided in a thin plate shape to be fixedly installed in the housing 1300 and may be integrated with the first terminal 1551 and the second terminal 1553.

In addition, the second control board 1557 is connected to one surface of the first control board 1550, and the third terminal 1555 may be disposed on the first control board 1550.

Here, a power supply signal of an external device is applied to the first control board 1550 through the first terminal 1551, a control signal of the external device is applied to the first control board 1550 through the second terminal 1553, and a control signal of the external device is applied to an actuator module 70 through the third terminal 1555.

As a result, in the network module 1000 according to the embodiment of the present invention, miniaturization and light weight can be implemented because a mutual coupling structure of the housing 1300 and the communication module 1500 with components is simple, various cables can be easily detached or attached when used due to the integrated first control board 1550 and second control board 1557 including the plurality of terminal portions, and a simple connection structure can be provided without interference between wiring bundles.

Meanwhile, as illustrated in FIG. 4, the through holes 1310 of the housing 1300 according to the present embodiment are disposed in a lattice pattern and the housing 1300 is selectively detachable from or attachable to an outer surface of a corresponding device.

Accordingly, a multi-directional coupling structure appropriate for a purpose of use may be implemented in the network module 1000 due to the lattice pattern of the through holes 1310 having a gap with a constant distance and a multiple of the constant distance in an outer surface of the housing 1300.

In addition, at least one guide groove 1330 may be provided in the housing 1300 such that mutual interference between wiring bundles coupled to the first terminal 1551, the second terminal 1553, and the third terminal 1555 of the communication module 1500 is prevented.

Here, because the wiring bundles are connected to the first terminal 1551, the second terminal 1553, and the third terminal 1555 of the communication module 1500 and are provided to transmit an electrical signal thereto, tangling of the wiring bundles when the housing 1300 and the communication module 1500 are coupled is prevented because the wirings are restricted to a space of the guide groove 1330.

Furthermore, when the wiring bundles are restricted to the guide groove 1330 using a component capable of integrating the wiring bundles such as a cable tie, an effect of preventing mutual interference between the wiring bundles may be further increased.

Figure 5:
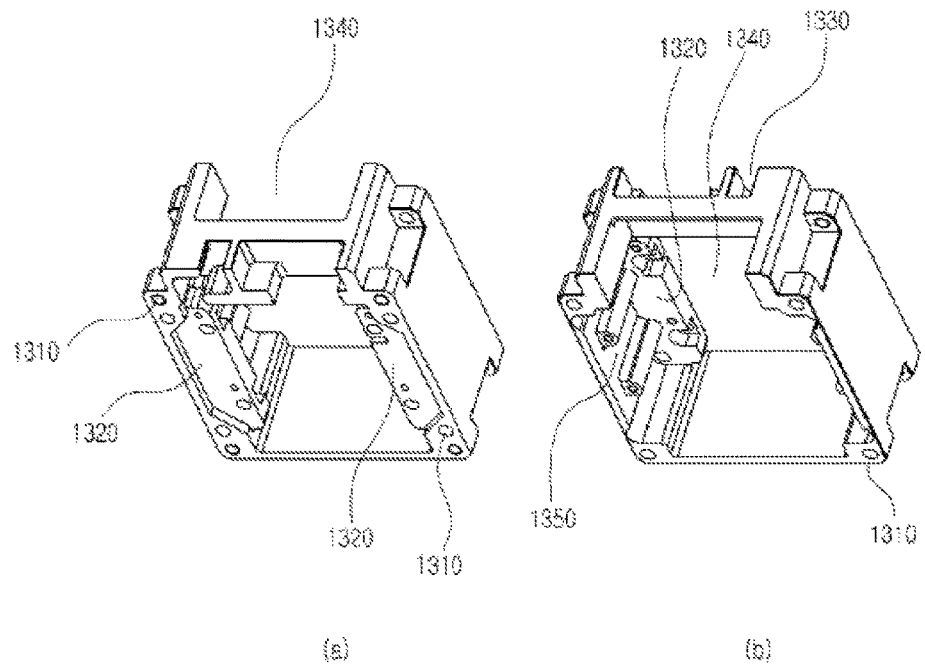
FIG. 5 is a view illustrating a housing of the detachable industrial network module according to the present invention.

FIG. 5 is a view illustrating a housing of the detachable industrial network module according to the present invention.

To describe FIG. 5 on the basis of the above-described housing 1300 according to the present embodiment, the housing 1300 of the network module 1000 is formed in an overall rectangular shape including an accommodation space.

As illustrated in FIGS. 5A and 5B, the plurality of through holes 1310 are disposed in front and rear surfaces of the housing 1300 in a lattice pattern for coupling, and the opening 1340 is formed toward one side of the housing 1300.

In addition, the pair of fixing members 1320 are provided inside the housing 1300, and the communication module 1500 is slidingly detachable through the seating portions 1350 formed to correspond to rear surfaces of the fixing members 1320.

In addition, at least one guide groove 1330 may be positioned above the fixing members 1320, and an auxiliary member may be further provided such that the guide groove 1330 and the internal accommodation space of the housing 1300 are divided.

Figure 6:
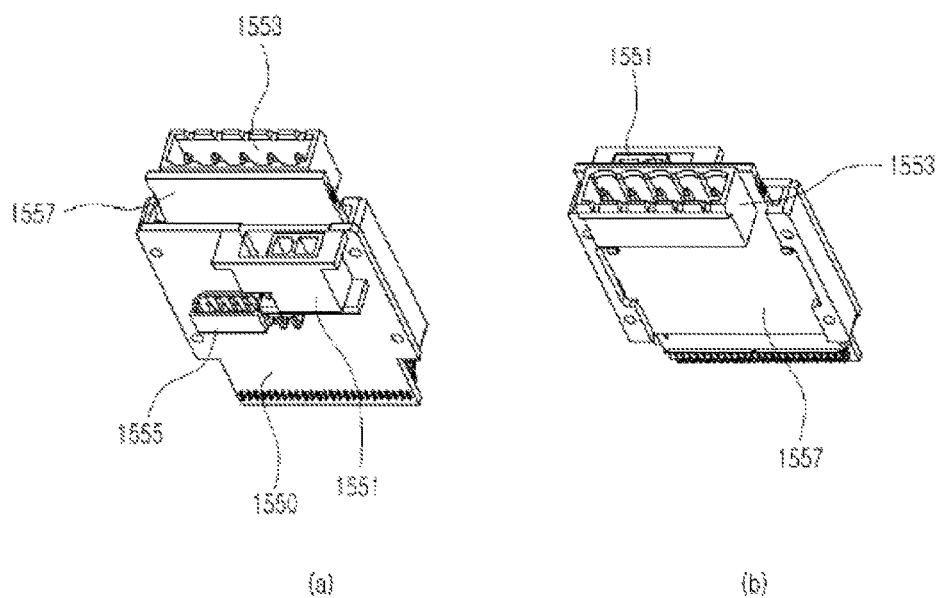
FIG. 6 is a view illustrating a communication module of the detachable industrial network module according to the present invention.

FIG. 6 is a view illustrating a communication module of the detachable industrial network module according to the present invention.

The communication module 1500 is provided with the first control board 1550 including the first terminal 1551 and the third terminal 1555, and the second control board 1557 coupled to one surface of the first control board 1550 and including the second terminal 1553.

As illustrated in FIG. 6, the second terminal 1553 of the communication module 1500 according to the present embodiment may be provided in a pluggable screw terminal type.

The second terminal 1553 is disposed at one side of the second control board 1557 to receive a control signal of an external device, for instance, connected through an industrial network, and the first terminal 1551 and the third terminal 1555 are disposed at the other side of the control board 1550.

Accordingly, because the plurality of terminal portions are provided in the first control board 1550 and the second control board 1557 of the communication module 1500, various control cables, sensor signal cables, electrical cables for communication with a host, and the like can be easily connected to the integrated first control board 1550 and the second control board 1557 such that electrical portions of an automation system are electrically connected to each other.

That is, the terminal portions including the first terminal 1551, the second terminal 1553, and the third terminal 1555 may perform a connector function for being connected to cables for motor control, sensor signals, and communication.

Meanwhile, the industrial network through which the control signal of an external device is applied to the second control board 1557 of the communication module 1500 may use one among CANopen, CC-Link, PROFIBUS, EtherCAT, PROFINET, and DeviceNet protocols.

However, the industrial network applied to the present invention is not limited to the plurality of industrial network protocols of this embodiment, and a conventional network protocol, such as RTEX (Panasonic), M-LINK (Yaskawa), and SSCNET (Mitsubishi), may be applied thereto.

Here, connecting components are additionally necessary according to the above-described network protocols, and for instance, RJ45 connectors may be provided for EtherCAT and PROFINET.

In addition, connectors are differently applied according to the network protocols, but these are conventional technologies recommended by corresponding network associations, and the network protocols and the components are not limited to those corresponding to each other.

In addition, in the above-described industrial network protocols, the corresponding communication master chips for each communication protocol may be used for the communication with the sub-controllers after data is converted into a data stream using a communication master and one PHY chip for effective communication with the sub-controllers.

Figure 7:
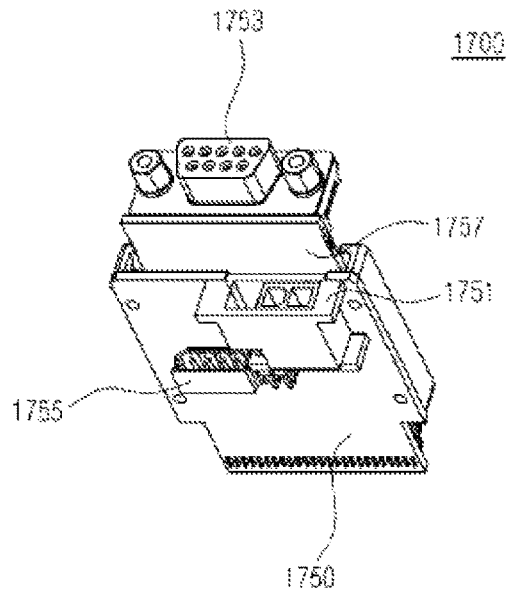
FIG. 7 is a view illustrating another embodiment of the communication module according to the present invention.
Figure 8:
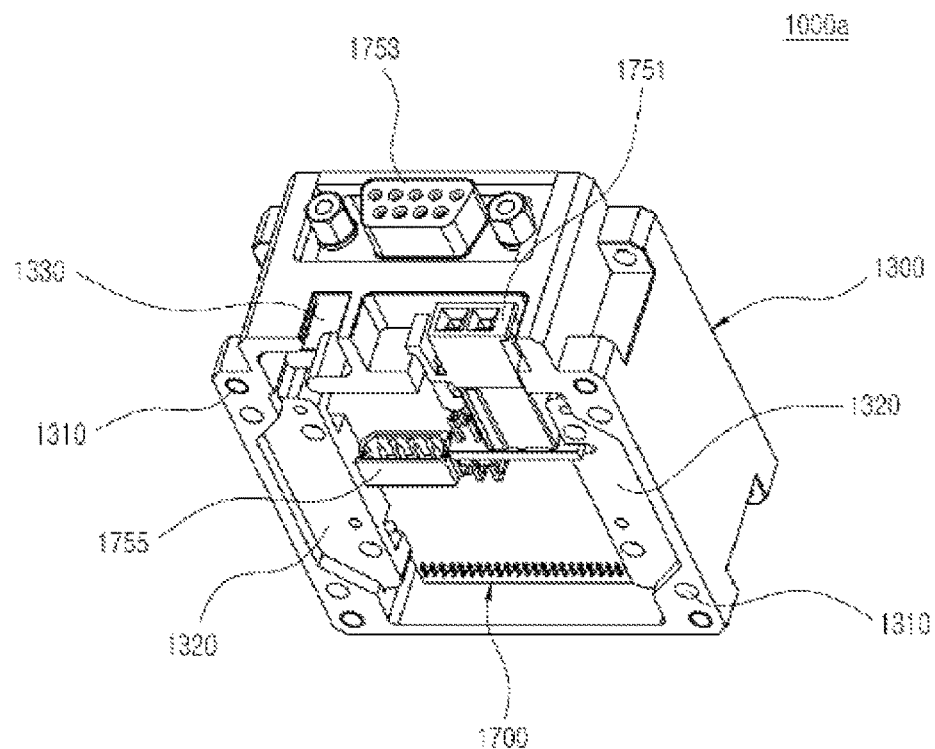
FIG. 8 is a view illustrating a detachable industrial network module to which the communication module shown in FIG. 7 is applied.

The following description of embodiment of the present invention will be based on FIG. 7 showing a view illustrating another embodiment of the communication module according to the present invention and FIG. 8 showing a view illustrating a detachable industrial network module to which the communication module shown in FIG. 7 is applied.

To describe FIGS. 7 and 8 with reference to a structure of the above-described network module 1000, a second terminal 1753 of a communication module 1700 may be provided in one among D-Subminiature, UCB, RJ45, BNC, and M12 types in addition to the above-described pluggable screw terminal type.

The second terminal 1753 in the D-Subminiature type according to the present embodiment may be provided as an upward-protrusive type, may be connected to a first control board 1750 through to a second control board 1757, and may transmit a signal to a first terminal 1751 and a third terminal 1755.

Furthermore, as illustrated in FIG. 8, when a network module 1000a is provided by coupling a housing 1300 and the communication module 1700 in the D-Subminiature type, the second terminal 1753 of the communication module 1700 protrudes upward through an opening 1340 of the housing 1300.

In addition, the first control board 1750 of the communication module 1700 is seated on and appropriately fixed to a pair of fixing members 1320, and may be moved to the outside of the housing 1300 by restricting wiring bundles connected to the first terminal 1751, the second terminal 1753, and the third terminal 1755 to a guide groove 1330 of the housing 1300.

Figure 9:
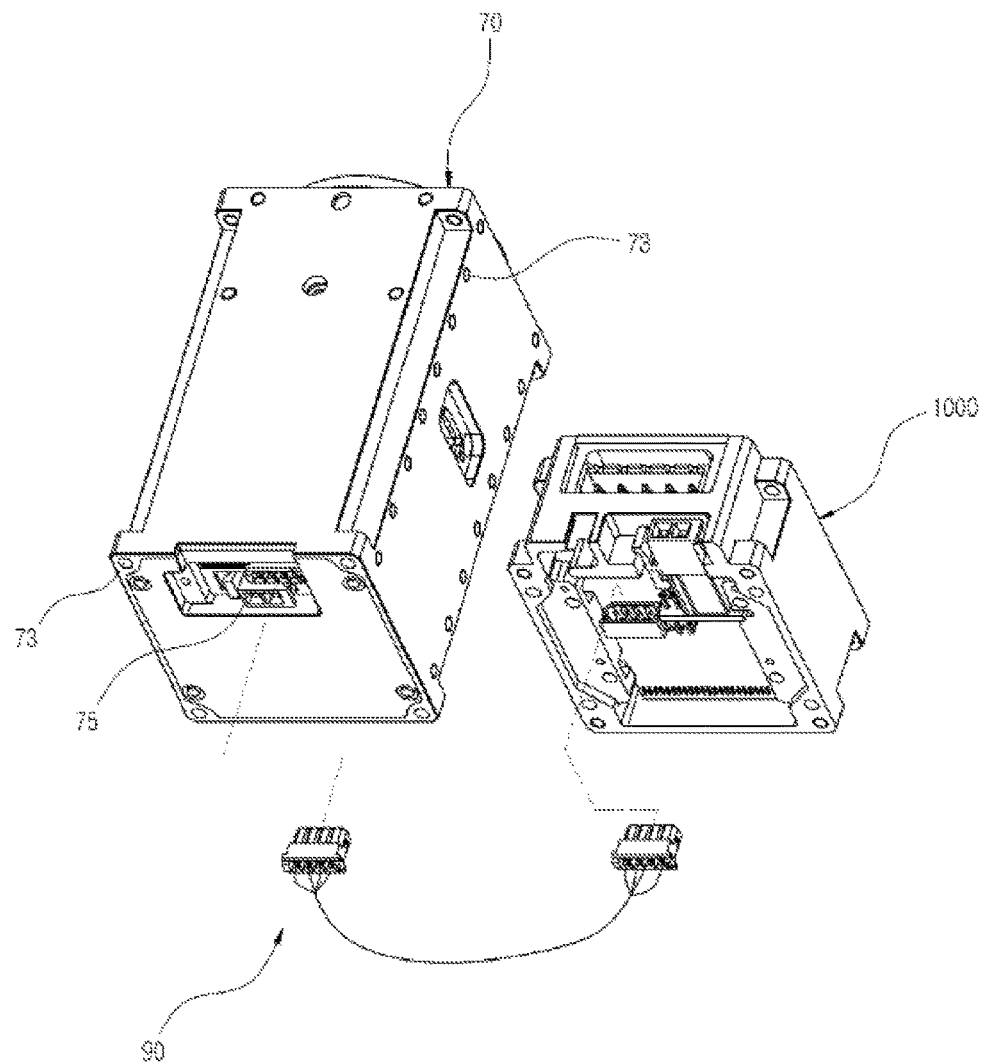
FIG. 9 is a view illustrating connection between the detachable industrial network module and the actuator module according to the present invention by a sub-connector.

FIG. 9 is a view illustrating connection between the detachable industrial network module and the actuator module according to the present invention by a sub-connector.

As illustrated in FIG. 9, because through holes 1310 of the housing 1300 according to the present embodiment are formed in a lattice pattern, coupling holes 73 may be provided in an outer surface of an actuator module 70 having a decelerator (not shown) and a motor (not shown) to correspond to the lattice pattern.

In addition, the communication module 1500 is electrically connected to the actuator module 70 using a sub-connector 90, and one end and the other end of the sub-connector 90 may be respectively coupled to an actuator terminal portion 75 and a third terminal 1555 of the above-described communication module 1500.

Here, interference between other wirings may be prevented and an external arrangement may be implemented by restricting a wiring provided in the sub-connector 90 to the above-described guide groove 1330 of the housing 1300.

Furthermore, when a mutual connecting process between the network module 1000 and the actuator module 70 is prolonged because of the short wiring of the sub-connector 90, a sufficient length of the wiring may be obtained by further adding a wiring extension component to one end or the other end of the sub-connector 90.

In addition, when the wiring of the sub-connector 90 becomes long due to the wiring extension component, the wiring may be restricted to the above-described guide groove 1330 of the housing 1300 using a wiring arrangement member such as a cable tie.

Figure 10:
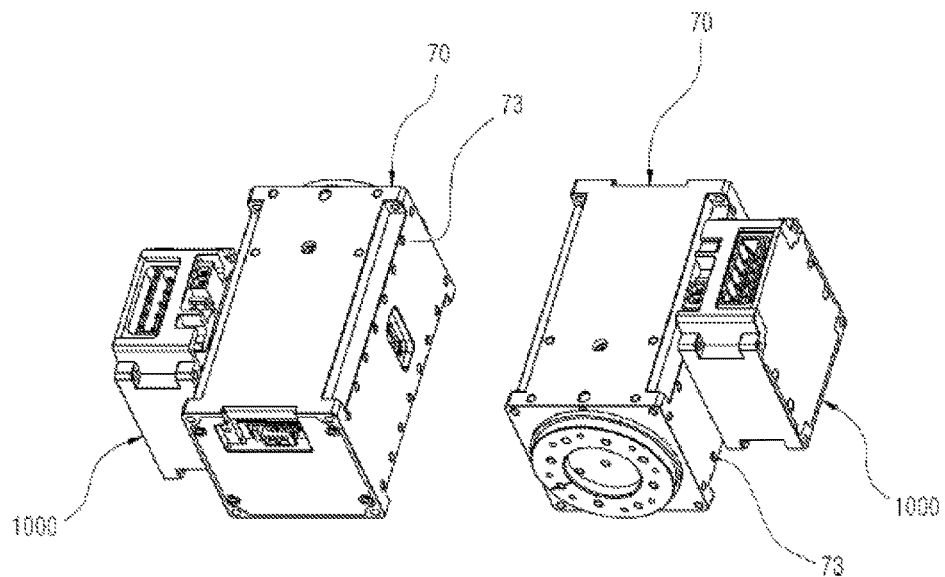
FIGS. 10 and 11 are views illustrating examples of which the detachable industrial network module according to the present invention is applied.
Figure 11:
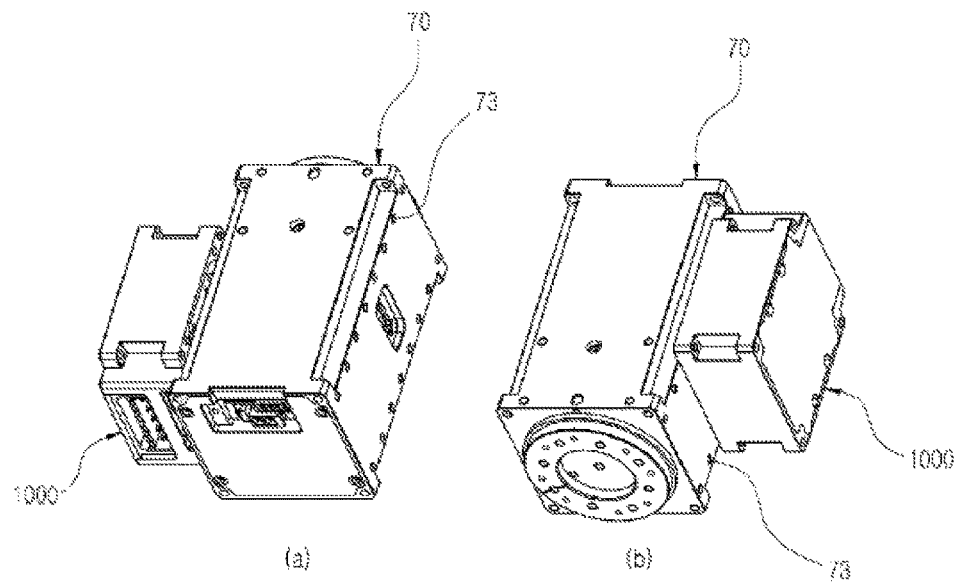

FIGS. 10 and 11 are views illustrating examples to which the detachable industrial network module according to the present invention is applied.

The network module 1000 or 1000a may be used by easily detaching or attaching various cables, and a simple connection structure may be provided without interference between wiring bundles of the cables according to the embodiments illustrated in FIGS. 2 to 9.

In addition, because the miniaturized and lightened network module 1000 or 1000a is implemented, structural utilization can be increased by applying various coupling methods to one actuator module 70.

Accordingly, as illustrated in FIGS. 10A and 10B, because the second terminal 1553 of the communication module 1500 in the network module 1000 is positioned in an upper direction, the second terminal 1553 is detachable from or attachable to one side of the actuator module 70. Conversely, the second terminal 1553 may also be detached from or attached to the other side of the actuator module 70 while positioned in the upper direction.

Meanwhile, depending on the situation, as illustrated in FIGS. 11A and 11B, the second terminal 1553 of the communication module 1500 may be implemented to be detached from or attached to one side or the other side of the actuator module 70 by pivoting in a right or left direction.

In a process in which the network module 1000 according to the present embodiment is appropriately coupled to the actuator module 70, although not illustrated in detail, such that fastening and unfastening the members are configured for easy coupling and detachment, and careful handling is necessary to prevent loss or material deformation of the members.

In addition, because lengths of the wiring bundles connected to the actuator module 70 may vary due to a detachable coupling structure of the network module 1000, an auxiliary member, such as a wiring extension component, a cable tie, etc., is necessary during a coupling process to prevent mutual electrical connectivity from being weakened.

In addition, when the second terminal 1553 of the communication module 1500 is coupled in a lower direction, because a phenomenon in which communication ends when a wiring connected to an external device is separated due to an external force may occur, various coupling methods should be performed while a coupling state of the wiring is verified during a coupling process.

Meanwhile, a signal device may also be provided on an outer surface of the housing 1300 or an outer surface of the actuator module 70 so that it can be simply determined from the outside whether the network module 1000 and the actuator module 70 are electrically connected to each other with a suitable electrical level.

The above description is only exemplary, and it will be understood by those skilled in the art that the invention may be embodied in other concrete forms without changing the technological scope and essential features. Therefore, the above-described embodiments should be considered only as examples in all aspects and not for purposes of limitation. For example, each component described as a single type may be realized in a distributed manner, and similarly, components that are described as being distributed may be realized in a coupled manner.

The scope of the present invention is defined by the appended claims, and encompasses all modifications or alterations derived from meanings, the scope and equivalents of the appended claims.

The invention claimed is:

1. A detachable industrial network module which is detachable from or attachable to an actuator module, the detachable industrial network module comprising:
    a housing in which a plurality of through holes are formed; and
    a communication module embedded in the housing and including a plurality of terminal portions,
    wherein:
    the through holes of the housing are provided in a lattice pattern and the housing is selectively detachable from or attachable to an outer surface of the actuator module,
    the housing includes a pair of fixing members to prevent the communication module from moving away from or falling off of the housing, and
    each of the fixing members includes a seating portion that facilitates insertion and displacement of the communication module.

2. The detachable industrial network module of claim 1, wherein at least one guide groove is provided in the housing to prevent wiring bundles coupled to the terminal portions of the communication module from interfering with each other.

3. The detachable industrial network module of claim 1, wherein the communication module is electrically connected to the actuator module by a sub-connector as a medium.

4. The detachable industrial network module of claim 1, wherein an opening which opens upward is provided at one side of the housing.

5. A detachable industrial network module which is detachable from or attachable to an actuator module, the detachable industrial network module comprising:
    a housing in which a plurality of through holes are formed; and
    a communication module embedded in the housing and including a plurality of terminal portions, wherein the through holes of the housing are provided in a lattice pattern and the housing is selectively detachable from or attachable to an outer surface of the actuator module, the communication module is electrically connected to the actuator module by a sub-connector as a medium, the communication module further includes:

a first control board fixedly installed at the housing; and a second control board coupled to one surface of the first control board; and the plurality of terminal portions includes:

a first terminal through which a power signal is applied to the first control board;

a second terminal through which a control signal is applied to the first control board; and a third terminal connected to the sub-connector through which the control signal is applied to the actuator module.

6. The detachable industrial network module of claim 5, wherein:

the second terminal is disposed at one side of the first control board;

the first terminal is disposed at the other side; and the third terminal is disposed on the second control board.

7. The detachable industrial network module of claim 5, wherein the second terminal of the communication module includes one among pluggable screw terminal, D-Subminiature, USB, RJ45, BNC, and M12 types.

8. The detachable industrial network module of claim 5, wherein the control signal is provided through an industrial network, wherein the industrial network uses one among CANopen, CC-Link, PROFIBUS, EtherCAT, PROFINET, and DeviceNet protocols.

9. The detachable industrial network module of claim 1, wherein coupling holes are provided in an outer surface of the actuator module to correspond to the through holes of the housing.

* * * * *